United States Patent
Oh et al.

(10) Patent No.: US 8,373,273 B2
(45) Date of Patent: *Feb. 12, 2013

(54) METHODS OF FORMING INTEGRATED CIRCUIT DEVICES HAVING DAMASCENE INTERCONNECTS THEREIN WITH METAL DIFFUSION BARRIER LAYERS AND DEVICES FORMED THEREBY

(75) Inventors: Hyeok-Sang Oh, Suwon-si (KR); Woo-Jin Jang, Seoul (KR); Bum-Ki Moon, LaGrangeville, NY (US); Ji-Hong Choi, Fishkill, NY (US); Minseok Oh, Pleasant Valley, NY (US); Tien-Jen Cheng, Bedford, NY (US)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/533,135

(22) Filed: Jun. 26, 2012

(65) Prior Publication Data

US 2012/0267785 A1    Oct. 25, 2012

Related U.S. Application Data

(63) Continuation of application No. 13/051,732, filed on Mar. 18, 2011, now Pat. No. 8,232,200.

(51) Int. Cl.
*H01L 23/48* (2006.01)
*H01L 23/52* (2006.01)
*H01L 29/40* (2006.01)

(52) U.S. Cl. ......... 257/758; 257/E21.575; 257/E21.579; 257/E21.584; 257/E23.145; 257/E23.151; 257/E23.175; 257/621; 257/700; 257/774; 438/597; 438/618; 438/626; 438/627; 438/637; 438/643; 438/653; 438/678; 438/687

(58) Field of Classification Search ............... 257/621, 257/700, 774, E23.145, E23.151, E23.175, 257/E21.575, E21.579, E21.584; 438/597, 438/618, 626, 627, 637, 643, 653, 678, 687

See application file for complete search history.

(56) References Cited

U.S. PATENT DOCUMENTS

| | | | |
|---|---|---|---|
| 6,583,043 B2 | 6/2003 | Shroff et al. | 438/618 |
| 6,833,321 B2 | 12/2004 | Hau-Riege et al. | 438/659 |
| 7,964,496 B2 | 6/2011 | Yu et al. | 438/627 |
| 8,143,162 B2 | 3/2012 | Yu et al. | 438/687 |
| 8,232,200 B1 * | 7/2012 | Oh et al. | 438/643 |
| 2008/0120580 A1 | 5/2008 | Hsu et al. | 716/5 |
| 2008/0197499 A1 | 8/2008 | Yang et al. | 257/758 |
| 2009/0051033 A1 | 2/2009 | Gosset et al. | 257/751 |
| 2009/0065939 A1 | 3/2009 | Suzuki | 257/751 |
| 2009/0186481 A1 | 7/2009 | Suzuki et al. | 438/686 |
| 2009/0189287 A1 | 7/2009 | Yang et al. | 257/769 |
| 2009/0275195 A1 * | 11/2009 | Yu et al. | 438/637 |

FOREIGN PATENT DOCUMENTS

| | | |
|---|---|---|
| JP | 2002-118111 | 4/2002 |
| JP | 2006-156592 | 6/2006 |
| KR | 1020050068868 A | 7/2005 |

* cited by examiner

*Primary Examiner* — Asok K Sarkar
(74) *Attorney, Agent, or Firm* — Myers Bigel Sibley & Sajovec, P.A.

(57) ABSTRACT

Methods of forming integrated circuit devices include forming an interlayer insulating layer having a trench therein, on a substrate and forming an electrical interconnect (e.g., Cu damascene interconnect) in the trench. An upper surface of the interlayer insulating layer is recessed to expose sidewalls of the electrical interconnect. An electrically insulating first capping pattern is formed on the recessed upper surface of the interlayer insulating layer and on the exposed sidewalls of the electrical interconnect, but is removed from an upper surface of the electrical interconnect. A metal diffusion barrier layer is formed on an upper surface of the electrical interconnect, however, the first capping pattern is used to block formation of the metal diffusion barrier layer on the sidewalls of the electrical interconnect. This metal diffusion barrier layer may be formed using an electroless plating technique.

5 Claims, 10 Drawing Sheets

METHODS OF FORMING INTEGRATED CIRCUIT DEVICES HAVING DAMASCENE INTERCONNECTS THEREIN WITH METAL DIFFUSION BARRIER LAYERS AND DEVICES FORMED THEREBY

REFERENCE TO PRIORITY APPLICATION

This application is a continuation of U.S. patent application Ser. No. 13/051,732, filed Mar. 18, 2011, now U.S. Pat. No. 8,232,200, the contents of which are hereby incorporated herein by reference.

FIELD

The present invention relates to methods of forming integrated circuit devices and, more particularly, to methods of forming integrated circuit devices using damascene process techniques and devices formed thereby.

BACKGROUND

As semiconductor devices become more highly integrated, the demand for reliable interconnects is increasing. Copper is becoming the interconnect material of choice for semiconductor devices because it has a relatively high melting point compared with aluminum and thus has low resistivity and superior resistance to electromigration (EM) and stress migration (SM).

SUMMARY

Methods of forming integrated circuit devices according to embodiments of the invention include forming an interlayer insulating layer having a trench therein, on a substrate and forming an electrical interconnect (e.g., Cu damascene interconnect) in the trench. An upper surface of the interlayer insulating layer is recessed to expose sidewalls of the electrical interconnect. An electrically insulating first capping pattern is formed on the recessed upper surface of the interlayer insulating layer and on the exposed sidewalls of the electrical interconnect, but is removed from an upper surface of the electrical interconnect. A metal diffusion barrier layer is formed on an upper surface of the electrical interconnect, however, the first capping pattern is used to block formation of the metal diffusion barrier layer on the sidewalls of the electrical interconnect. This metal diffusion barrier layer may be formed using an electroless plating technique.

According to some of these embodiments of the invention, the metal diffusion barrier layer may be a CoWP layer and the first capping pattern may be a material selected from a group consisting of SiC, SiCN, SiCO and SiN. In addition, the step of forming an electrically insulating first capping pattern may include depositing an electrically insulating first capping layer on the recessed upper surface of the interlayer insulating layer and on the exposed sidewalls and upper surface of the electrical interconnect. The first capping layer is then selectively removed from the upper surface of the electrically interconnect using a planarization technique. The step of forming an electrical interconnect may also be preceded by a step of lining a sidewall of the trench with a metal layer comprising at least one of Ti, Ta, W, Ru, TiN, TaN, WN, TiZrN, TiSiN, TaAlN, TaSiN, TaSi2 and TiW.

According to still further embodiments of the invention, the step of forming an interlayer insulating layer is preceded by the steps of forming a SiCOH layer having a damascene interconnect therein, on the substrate, and forming an etch stop layer on the SiCOH layer and the damascene interconnect. The etch stop layer may include a material selected from a group consisting of SiN, SiC, SiON and SiCN. The step of selectively forming a metal diffusion barrier layer may also be followed by a step of forming a second capping layer on the metal diffusion barrier layer. This second capping layer may include a material selected from a group consisting of SiC, SiCN, SiCO and SiN. In some additional embodiments of the invention, a step may be performed to cure the second capping layer using an NH3 plasma.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the sizes and relative sizes of layers and regions are exaggerated for clarity.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Hereinafter, exemplary embodiments of the present invention will be described in detail with reference to the attached drawings.

FIGS. 1 through 9 are diagrams for explaining a method of fabricating a semiconductor device 1 according to an exemplary embodiment of the present invention. The fabrication method according to the current exemplary embodiment uses a dual damascene method as an example. However, a single damascene method can also be used.

Figure 1:
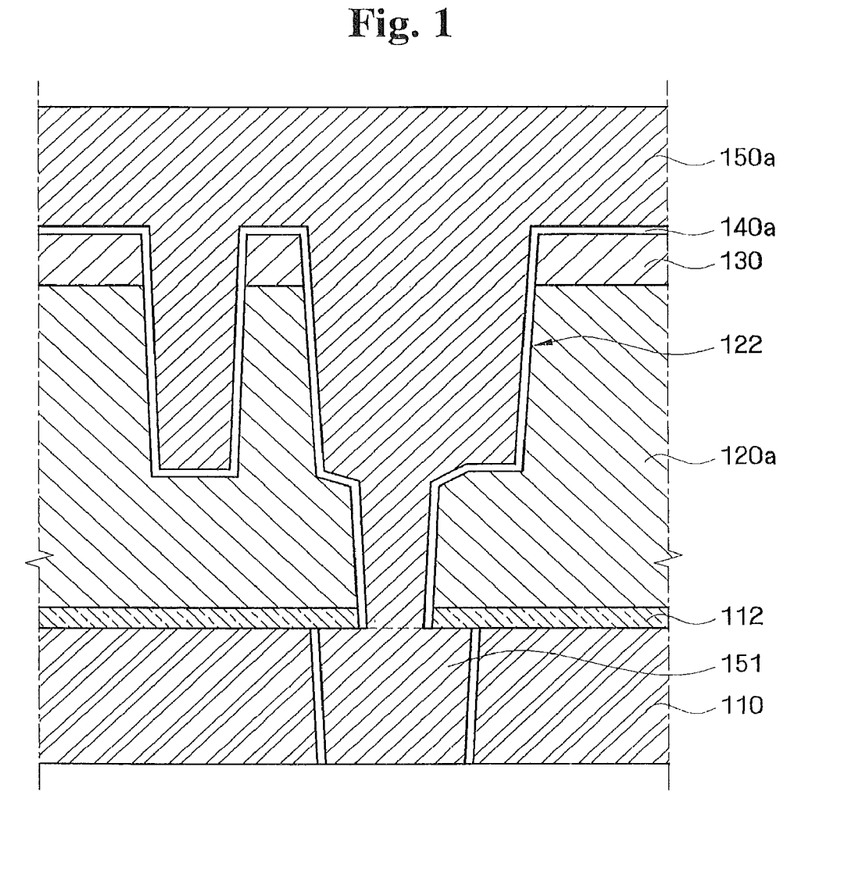
FIGS. 1 through 9 are diagrams for explaining a method of fabricating a semiconductor device according to an exemplary embodiment of the present invention.

Referring to FIG. 1, a lower interlayer insulating film 110 is formed on a semiconductor substrate, and a damascene interconnect 151 is formed in the lower interlayer insulating film 110. In addition, an etch-stop film 112 is formed on the lower interlayer insulating film 110 and the damascene interconnect 151. A first interlayer insulating film 120a and a hard mask 130 are formed on the etch-stop film 112. The etch-stop film 112 may be formed of, e.g., SiN, SiC, SiON, or SiCN by using mostly a chemical vapor deposition (CVD) method.

The lower interlayer insulating film 110 and the first interlayer insulating film 120a may be formed using various insulating materials. For example, the lower interlayer insulating film 110 and the first interlayer insulating film 120a may be formed using a low-k dielectric material such as p-SiCOH. A trench 122 is formed in the first interlayer insulating film 120a. Here, the trench 122 may be formed using the hard mask 130. The trench 122 may penetrate the etch-stop film 112 to expose the damascene interconnect 151.

A diffusion preventing film 140a is formed on a top surface of the first interlayer insulating film 120a (specifically, a top surface of the hard mask 130) and along inner walls of the trench 122. Copper has low resistivity and superior resistance to electromigration compared with aluminum alloys. However, since copper readily diffuses to an insulating film, it may change characteristics of a semiconductor device. Here, the diffusion preventing film 140a prevents the diffusion of copper (i.e., a damascene interconnect). The diffusion preventing film 140a may be made of a material which does not react with copper or copper alloys nor has a high fusion point. For example, the diffusion preventing film 140a may be made of Ti, Ta, W, Ru, TiN, TaN, WN, TiZrN, TiSiN, TaAlN, TaSiN, TaSi2, TiW, a combination of the same, or a laminate of the same. The diffusion preventing film 140a may be formed using a physical vapor deposition (PVD) method, an atomic layer deposition (ALD) method, a CVD method, or the like.

A conductive film 150a is formed to fully fill the trench 122. The conductive film 150a may contain copper. For example, a copper seed layer may be formed in the trench 122 by using a PVD method. Then, the conductive film 150a may be formed using a method that provides superior filling properties, such as an electroplating method, an electroless plating method, or a metal organic chemical vapor deposition (MOCVD) method.

Figure 2:
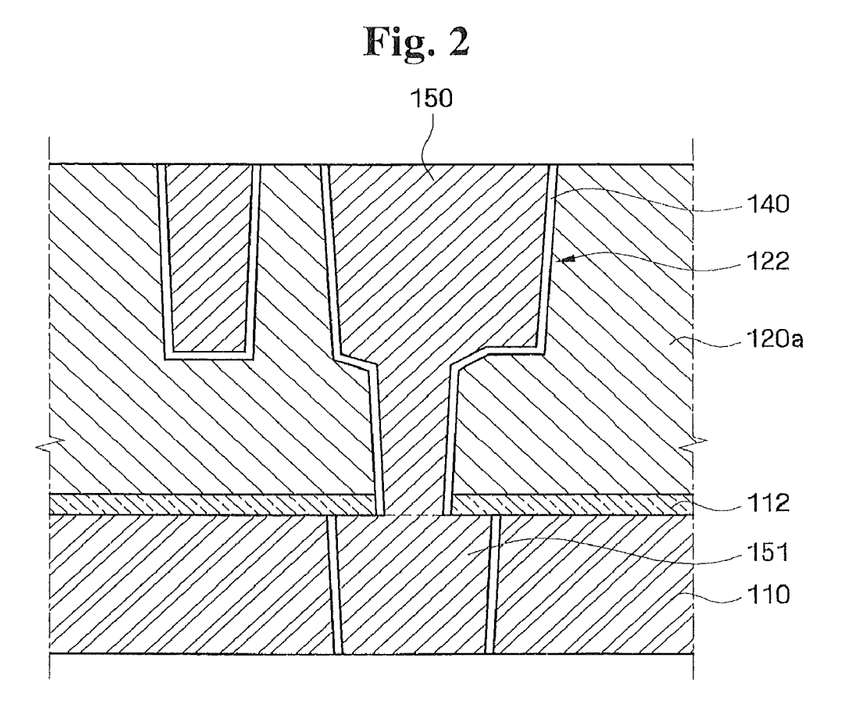

Referring to FIG. 2, a portion of the conductive film 150a is removed to expose the top surface of the first interlayer insulating film 120a, thereby forming another damascene interconnect 150. Here, the top surface of the first interlayer insulating film 120a may be at the same level as a top surface of the damascene interconnect 150. The damascene interconnect 150 may be formed using, e.g., a chemical mechanical polishing (CMP) method. Here, a portion of the diffusion preventing film 140a, which is formed on the top surface of the first interlayer insulating film 120a, may also be removed, thereby forming a diffusion preventing pattern 140.

Figure 3:
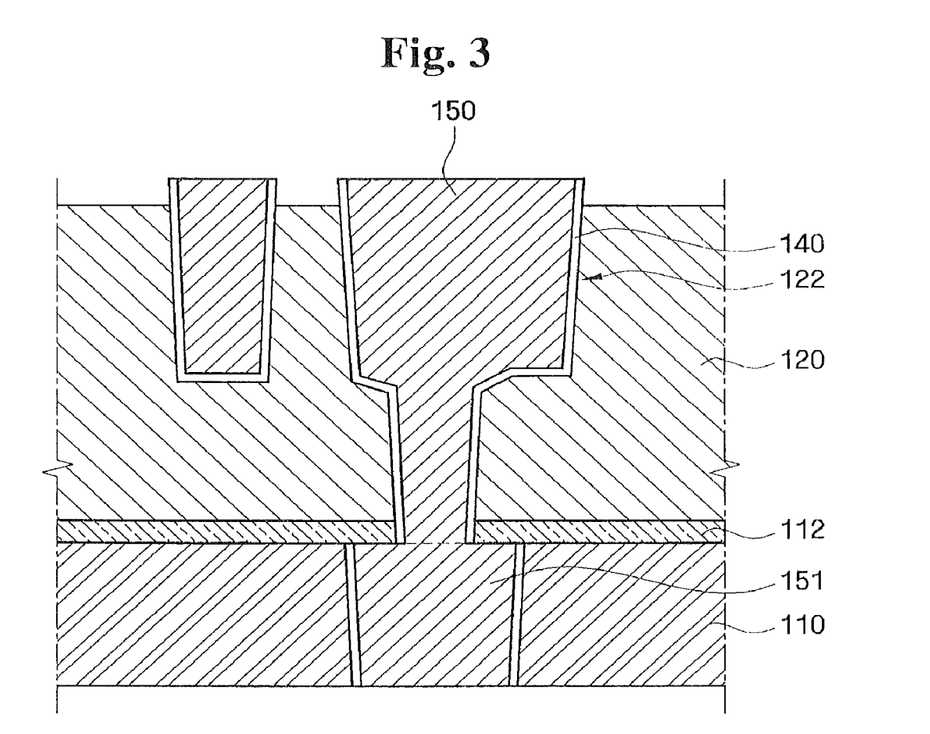

Referring to FIG. 3, a second interlayer insulating film 120 is formed by removing a portion of the top surface of the first interlayer insulating film 120a. Specifically, a top surface of the second interlayer insulating film 120 may be formed lower than the top surface of the damascene interconnect 150. That is, the damascene interconnect 150 may protrude upward beyond the second interlayer insulating film 120. The second interlayer insulating film 120 may be formed using a CMP method, a reactive ion etching (RIE) method, or a wet etching method.

Figure 4:
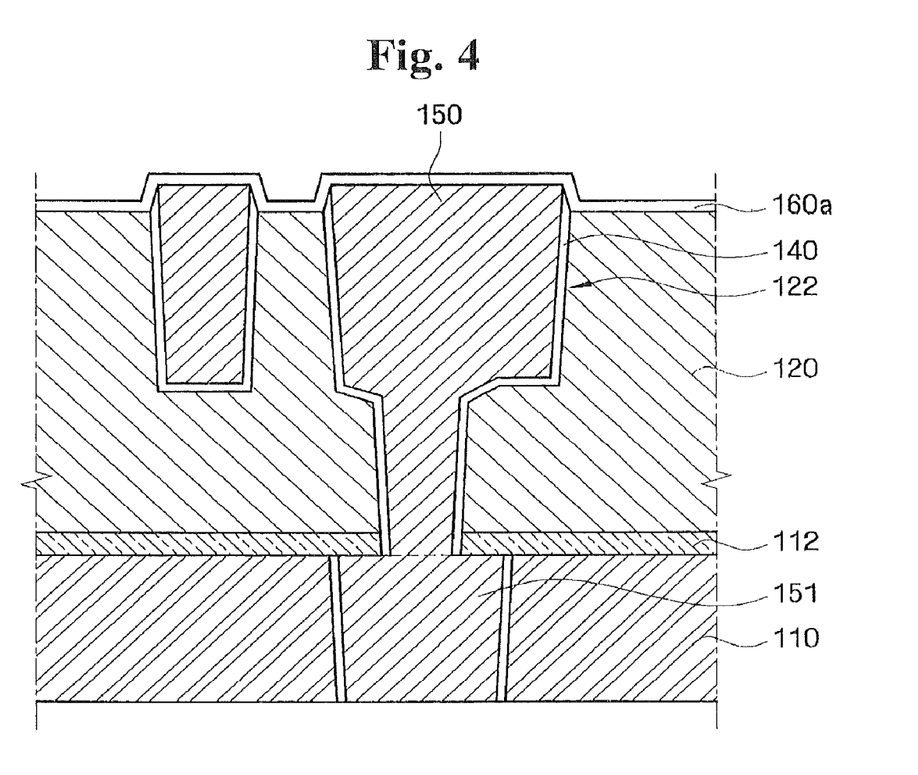

Referring to FIG. 4, a first capping film 160a may be formed along the top surface of the second interlayer insulating film 120 and a top surface of a protruding region of the damascene interconnect 150. Specifically, the first capping film 160a may contain at least one of SiC, SiCN, SiCO, and SiN. Meanwhile, the second interlayer insulating film 120 may be cured using NH3 plasma between the forming of the second interlayer insulating film 120 (that is, the forming of the protruding damascene interconnect 150) (the process illustrated in FIG. 3) and the forming of the first capping film 160a (the process illustrated in FIG. 4). For example, if a CMP method is used to form the second interlayer insulating film 120, the surface of the second interlayer insulating film 120 may be damaged. This damage can be removed using NH3 plasma.

Figure 5:
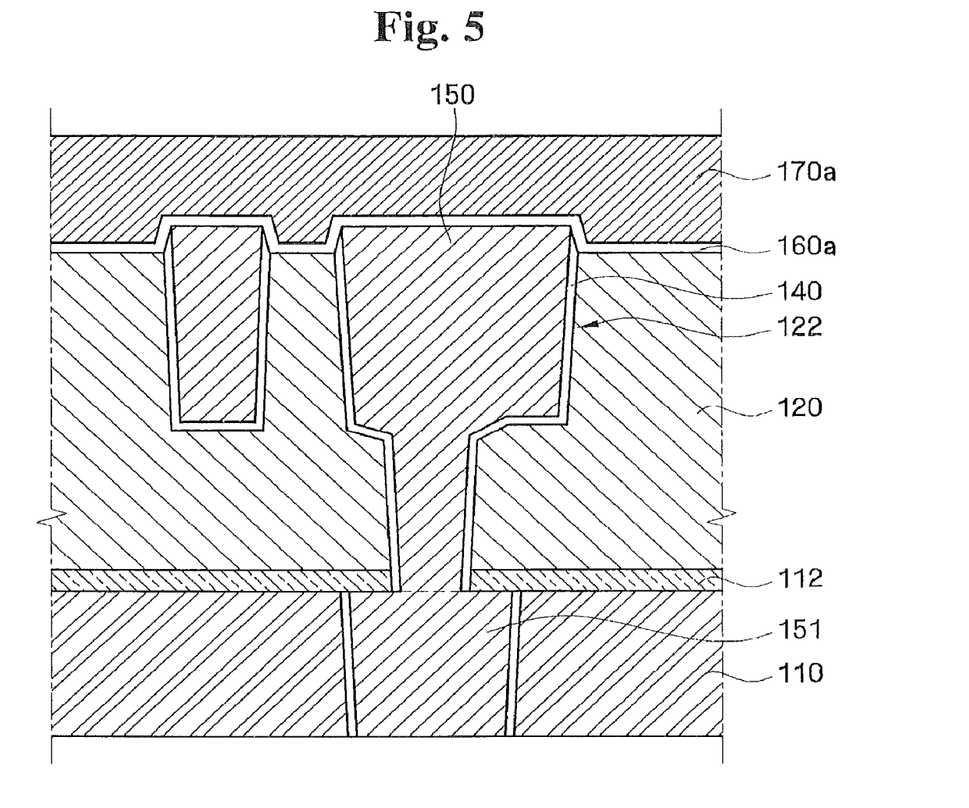

Referring to FIG. 5, a planarization film 170a is formed on the first capping film 160a. Specifically, the planarization film 170a may be a spin on glass (SOG) oxide film or an organic film The organic film may be a photoresist layer, an organic planarization layer (OPL), or the like. The planarization film 170a is a necessary film in the fabrication of the semiconductor device 1 and serves as a sacrificial layer since it is completely removed later.

Figure 6:
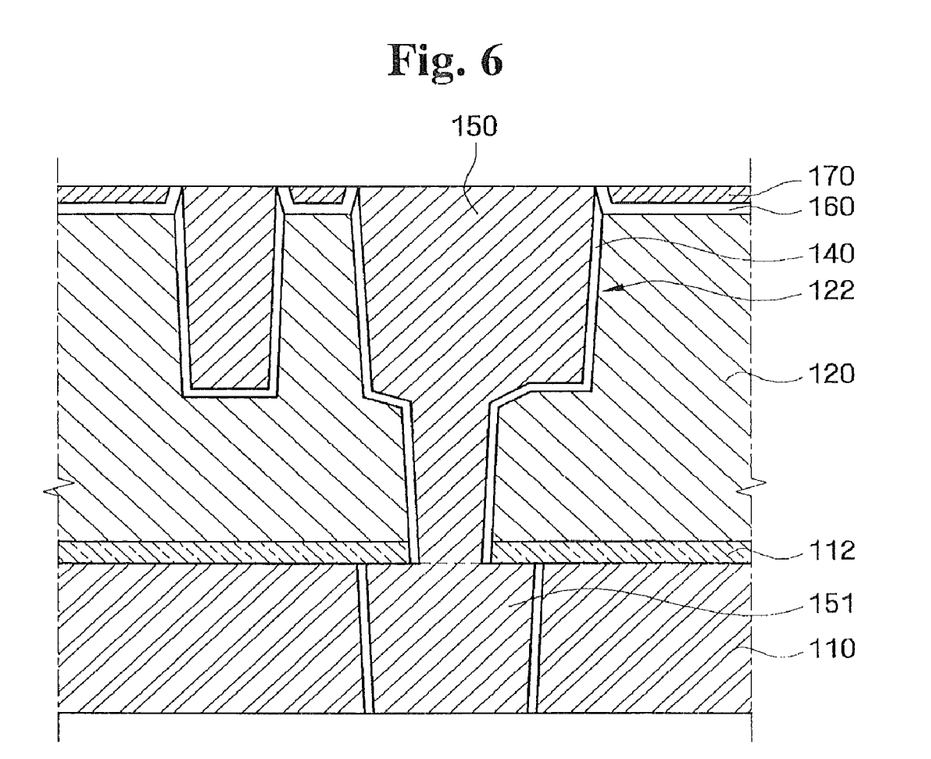

Referring to FIG. 6, the top surface of the damascene interconnect 150 is exposed. Specifically, a portion of the planarization film 170a and a portion of the first capping film 160a, which is formed on the top surface of the protruding region of the damascene interconnect 150, are removed using an etch-back process, thereby forming a planarization pattern 170 and a first capping pattern 160. For example, the planarization pattern 170 and the first capping pattern 160 may be formed by etching back the planarization film 170a and the first capping film 160a at the same etch rate. After the etch-back process, at least the first capping pattern 160 must remain on the top surface of the second interlayer insulating film 120.

Figure 7:
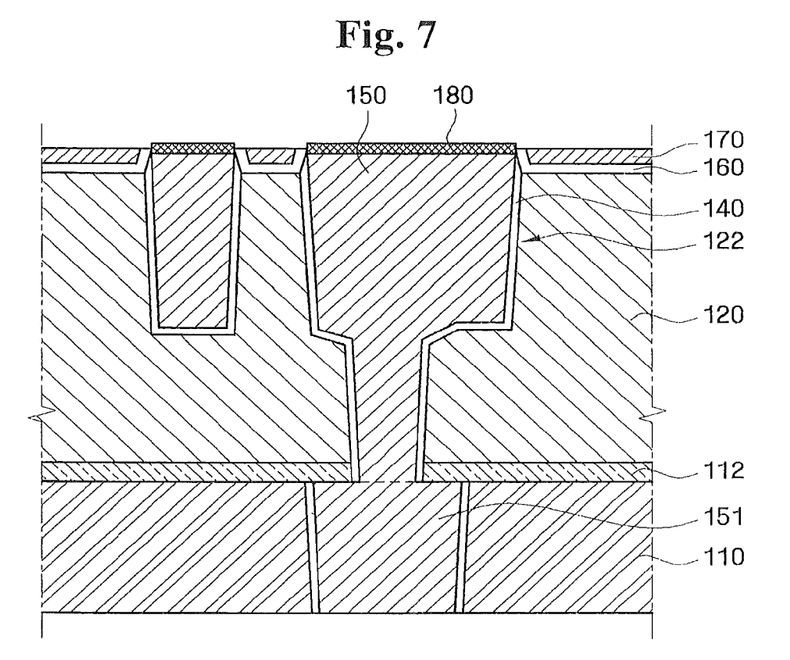

Referring to FIG. 7, a selective metal diffusion barrier 180 is formed on the exposed top surface of the damascene interconnect 150. Specifically, like the diffusion preventing pattern 140, the selective metal diffusion barrier 180 prevents the diffusion of copper (i.e., a damascene interconnect). The selective metal diffusion barrier 180 may be, for example, a CoWP film. In addition, the selective metal diffusion barrier 180 may be formed only on the exposed damascene interconnect 150 by using, e.g., an electroless plating method. When a CoWP film is formed, if Co ions or W ions remain on an interlayer insulating film, the conductive Co or W ions may cause the leakage of current or a short circuit between metal interconnects. In the embodiment of the present invention, however, the first capping pattern 160 and the planarization pattern 170 are formed on the second interlayer insulating film 120. The first capping pattern 160 and the planarization pattern 170 prevent Co ions or W ions from remaining on the second interlayer insulating film 120. Therefore, the leakage of current or a short circuit between metal interconnects due to Co ions or W ions can be prevented.

Figure 8:
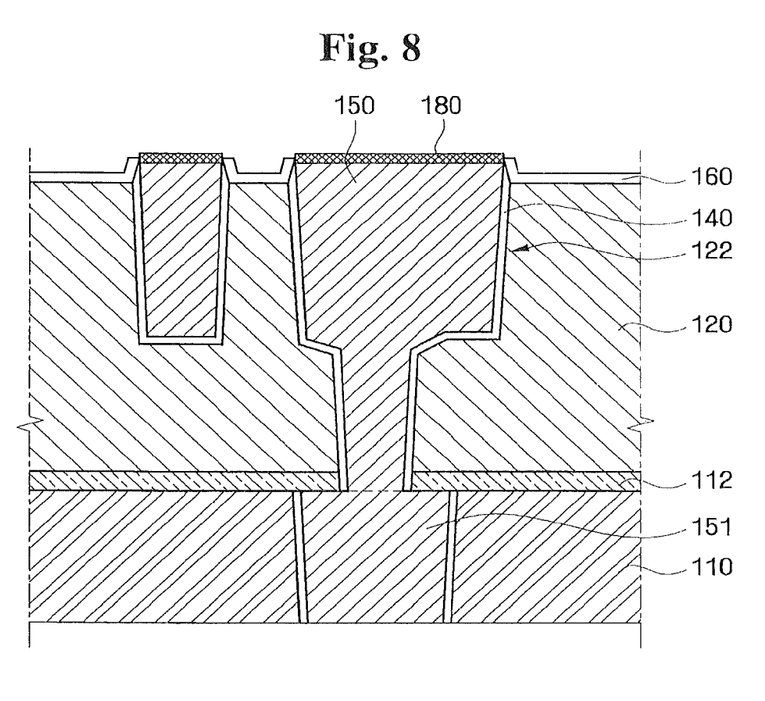

Referring to FIG. 8, the planarization pattern 170 remaining on the first capping pattern 160 is removed. For example, the planarization pattern 170 may be selectively removed using an etchant that has a high selectivity of the planarization pattern 170 to other films (i.e., the selective metal diffusion barrier 180 and the first capping pattern 160). The etchant may be, for example, hydrofluoric acid (HF). In the current exemplary embodiment, the wet etching method is used as an example. However, any method that ensures a high selectivity of the planarization pattern 170 to other films can be used.

Figure 9:
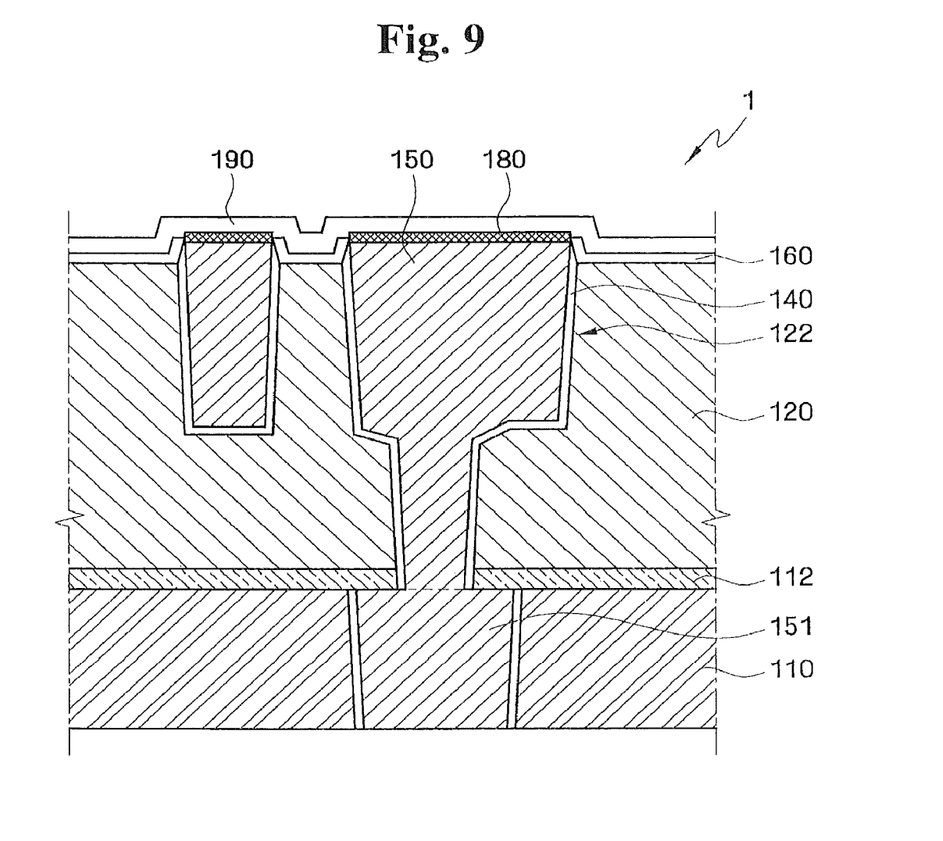

Referring to FIG. 9, a second capping film 190 is further formed on the first capping pattern 160 and the selective metal diffusion barrier 180. The second capping film 190 may be optionally formed if necessary. Specifically, the second capping film 190 may contain at least one of SiC, SiCN, SiCO, and SiN. The second capping film 190 and the first capping pattern 160 may be the same material or different materials. The first capping pattern 160 may be cured using NH3 plasma before the forming of the second capping film 190. For example, the damage done to the surface of the first capping pattern 160 may be removed using NH3 plasma.

In the method of fabricating the semiconductor device 1 according to the exemplary embodiment of the present invention, the top surface of the second interlayer insulating film 120 may be formed lower than the top surface of the damascene interconnect 150. In addition, after the first capping film 160a is formed, it is planarized to form the first capping pattern 160 on the top surface of the second interlayer insulating film 120. The first capping pattern 160 surrounds and thus protects the second interlayer insulating film 120 when the selective metal diffusion barrier 180 (i.e., a CoWP film) is formed. That is, the first capping pattern 160 prevents Co or W ions from remaining on the second interlayer insulating film 120. Accordingly, the semiconductor device 1 with a small leakage current and superior time dependent dielectric breakdown (TDDB) characteristics can be fabricated.

Hereinafter, the structure of the semiconductor device 1 according to the exemplary embodiment of the present invention will be described with reference to FIG. 9. The semiconductor device 1 according to the current exemplary embodiment of the present invention includes the second interlayer insulating film 120 in which the trench 122 is formed, the damascene interconnect 150 which fills the trench 122 and protrudes beyond the top surface of the second interlayer insulating film 120, the selective metal diffusion barrier 180 which is formed on the top surface of the damascene interconnect 150, the first capping pattern 160 which is formed on the top surface of the second interlayer insulating film 120 and a side surface of the protruding region of the damascene interconnect 150, and the second capping film 190 which is formed along a top surface of the first capping pattern 160 and a top surface of the selective metal diffusion barrier 180.

As described above, the second interlayer insulating film 120 contains p-SiCOH, the selective metal diffusion barrier 180 contains CoWP, the first capping pattern 160 contains at least one of SiC, SiCN, SiCO and SiN, and the second capping film 190 contains at least one of SiC, SiCN, SiCO and SiN.

Figure 10:
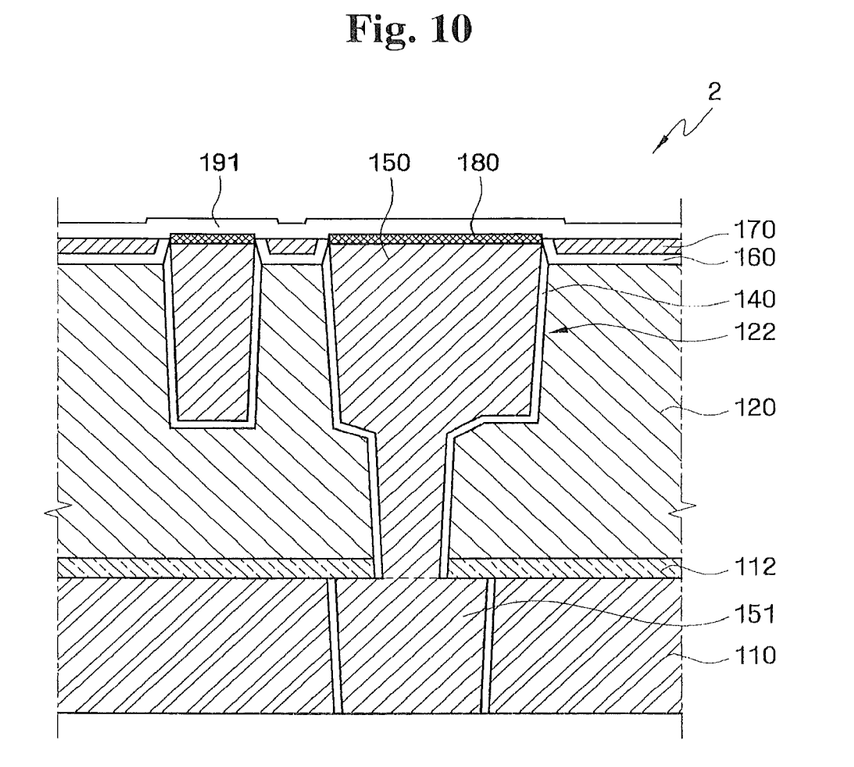
FIG. 10 is a diagram for explaining a method of fabricating a semiconductor device according to another exemplary embodiment of the present invention.

FIG. 10 is a diagram for explaining a method of fabricating a semiconductor device 2 according to another exemplary embodiment of the present invention. The fabrication method according to the current embodiment is different from the fabrication method according to the previous embodiment in that the process (see FIG. 8) of removing a planarization pattern 170 remaining on a first capping pattern 160 is omitted. Since the planarization pattern 170 remains in the semiconductor device 2 according to the current embodiment, a second capping film 191 is formed on the planarization pattern 170, the first capping pattern 160, and a selective metal diffusion barrier 180.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A method of fabricating a semiconductor device, the method comprising:
    forming a first interlayer insulating film on a semiconductor substrate by using p-SiCOH;
    forming a trench in the first interlayer insulating film;
    forming a conductive film to fill the trench;
    forming a damascene interconnect by removing a portion of the conductive film such that a top surface of the first interlayer insulating film is exposed;
    forming a second interlayer insulating film by removing a portion of the exposed top surface of the first interlayer insulating film such that a top surface of the second interlayer insulating film is lower than a top surface of the damascene interconnect;
    forming a first capping film along the top surface of the second interlayer insulating film and a side surface and a top surface of a protruding region of the damascene interconnect;
    forming a planarization film on the first capping film;
    forming a planarization pattern and a first capping pattern by removing a portion of the planarization film and a portion of the first capping film, which is formed on the top surface of the protruding region of the damascene interconnect, such that the top surface of the damascene interconnect is exposed;
    forming a CoWP film on the exposed top surface of the damascene interconnect;
    removing the planarization pattern; and
    forming a second capping film on the first capping pattern and the CoWP film.

2. The method of claim 1, wherein the first capping film contains at least one of SiC, SiCN, SiCO and SiN, and the second capping film contains at least one of SiC, SiCN, SiCO and SiN.

3. The method of claim 1, wherein the second interlayer insulating film is cured using NH3 plasma before the forming of the second interlayer insulating film and the forming of the first capping film.

4. A semiconductor device comprising:
    a first damascene interconnect formed in a lower interlayer insulating film which is formed on a semiconductor substrate;
    an interlayer insulating film which is formed on the lower interlayer insulating film and in which a trench is formed;
    a second damascene interconnect which fills the trench and directly contacts with the first damascene interconnect and protrudes beyond a top surface of the interlayer insulating film;
    a selective metal diffusion barrier which is formed on a top surface of the second damascene interconnect;
    a first capping pattern which is formed on the top surface of the interlayer insulating film and a side surface of a protruding region of the second damascene interconnect; and a second capping film which is formed along a top surface of the first capping pattern and a top surface of the selective metal diffusion barrier.

5. The semiconductor device of claim 4, wherein the interlayer insulating film contains p-SiCOH, the selective metal diffusion barrier contains CoWP, the first capping pattern contains at least one of SiC, SiCN, SiCO and SiN, and the second capping film contains at least one of SiC, SiCN, SiCO and SiN.

* * * * *

UNITED STATES PATENT AND TRADEMARK OFFICE
CERTIFICATE OF CORRECTION

| | |
|---|---|
| PATENT NO. | : 8,373,273 B2 |
| APPLICATION NO. | : 13/533135 |
| DATED | : February 12, 2013 |
| INVENTOR(S) | : Oh et al. |

It is certified that error appears in the above-identified patent and that said Letters Patent is hereby corrected as shown below:

On Title Page:
Item (73) Assignee should read:
-- Samsung Electronics Co., Ltd. (KR); International Business Machines Corporation (US); Advanced Micro Devices, Inc. (US); and Infineon Technologies AG (DE) --

Signed and Sealed this
Thirtieth Day of April, 2013

Teresa Stanek Rea
*Acting Director of the United States Patent and Trademark Office*